United States Patent [19]

Anderson et al.

[11] 4,343,001
[45] Aug. 3, 1982

[54] DIGITALLY TUNED ELECTRICALLY SMALL ANTENNA

[75] Inventors: Mardis V. Anderson, Richardson; Leslie V. Griffee; William H. Grona, both of Dallas; Richard D. Leverington, Plano, all of Tex.

[73] Assignee: Rockwell International Corporation, El Segundo, Calif.

[21] Appl. No.: 200,345

[22] Filed: Oct. 24, 1980

[51] Int. Cl.³ .......................... H01Q 9/26; H01Q 1/28
[52] U.S. Cl. ..................................... 343/745; 343/845
[58] Field of Search ............... 343/705, 708, 745, 747, 343/748, 845, 846

[56] References Cited

U.S. PATENT DOCUMENTS 3,381,222  4/1968  Gray ................................. 343/703
3,818,480  6/1974  West ................................. 343/845

Primary Examiner—Eli Lieberman
Attorney, Agent, or Firm—V. Lawrence Sewell; Howard R. Greenberg; H. Fredrick Hamann

[57] ABSTRACT

An antenna system suitable for airborne use is disclosed. The system is of the type having a blade forming a folded monopole antenna with one terminal serving as a radio frequency input and a second terminal connectable to tuning apparatus. Tuning components switchable to various values are connected at the second terminal. A processor receives the value of a new frequency to be used, computes from stored reference values the values of tuning components calculated to render the antenna in tune at the selected frequency, and commands the switching of the tuning components to the calculated values. A phase discriminator at the first terminal provides the processor with an indication of the extent to which the antenna is in tune at the selected frequency. If it is not in tune, the processor iteratively commands the switching of the tuning components until new values are reached for which the antenna is in tune. Then, in response to the new tuning component values, the processor can compute and store new reference values. After some period of use, the adaptive nature of the system results in an antenna which can switch from frequency to frequency at speeds compatible with contemporary radio designs.

5 Claims, 4 Drawing Figures

DIGITALLY TUNED ELECTRICALLY SMALL ANTENNA

BACKGROUND OF THE INVENTION

This invention relates to a digitally tuned antenna suitable for airborne use.

New radios have been developed which are capable of operating in both the VHF and UHF bands, and capable of fast switching between frequencies. It is an object of the present invention to provide an antenna system compatible with such radios and suitable for airborne use.

An airborne antenna must be small, so that among other things, it does not create excessive drag. A small antenna for these frequencies is quite inefficient, unless it is tuned to the particular frequency being used. Accordingly, an approach to providing a small airborne antenna which is useful over a relatively wide band is to make the antenna tunable over the band.

An existing antenna which deals with some aspects of this problem is the 437-1 VHF/FM Blade Antenna system of Rockwell International Corporation. At a first terminal of the radiating element of this system, is the radio frequency input, an inductance and a saturable reactor used for fine tuning. Also at this terminal is a phase discriminator for detecting phase as a measure of the extent to which the antenna is in or out of tune. Connected to the other terminal of the radiating element is a servo-driven variable capacitor for tuning the antenna. The output of the phase discriminator is used as an error signal to drive the capacitance to a value which tunes the antenna.

SUMMARY OF THE INVENTION

The antenna system of the present invention represents a more thoroughgoing solution to the requirements of the new radios. It is suitable for use over a very wide band including the UHF and VHF bands. At one terminal of the radiating element of the system is connected a phase discriminator, used to detect tuning error. At the other terminal are tuning components such as capacitors, which can be switched into and out of the circuit to achieve component values which tune the antenna. A controller, which can include a microprocessor, stores reference values, from which it can compute the values of tuning components which must be switched to tune the antenna for a particular frequency to be used. The phase discriminator conveys to the controller the amount of the tuning error. If the tuning component values computed by the controller do not produce sufficiently close tuning, then adjusted tuning component values are selected which do provide satisfactory tuning. Then the controller can alter its reference values accordingly.

The antenna system of the invention has a number of advantages as compared with prior art systems. It is very wide band. Yet it can be switched between frequencies (and tuned) at speeds compatible with current radios. One factor which contributes to the fast tuning of the antenna is the use of switched tuning components, rather than a servo-driven system. Also important is the use of known reference values to permit immediate switching of the antenna to a tuned condition at a new frequency. If something in the environment of the antenna changes, so that the reference values do not result in adequate tuning, then they can be modified. Thus, the system is an adaptive one. However, under stable conditions and after the antenna system has been used for a while, it can move to a tuned condition for a new frequency, without any followup adjustments of the tuning components. It will be understood that this operation results in very fast tuning.

The antenna system of the present invention has the additional advantage in that it can be tuned in radio silence. Systems such as the 437S-1 described above require the application of an RF signal to the antenna, so that the phase discriminator can operate. In the present antenna system, tuning components can ordinarily be switched to a new frequency setting without the operation of the phase discriminator.

The antenna system of the present invention is suitable for use with supersonic aircraft, as well as slower aircraft. Very important in this regard is the small size which can be obtained using the sophisticated tuning system conceived for the present invention. In addition, the tuning components and control elements for the present antenna system are preferably located not in the radiating antenna blade, but in a more interior protected location in the aircraft. Accordingly, these elements do not have to withstand the high temperatures encountered in supersonic flight.

BRIEF DESCRIPTION OF THE DRAWINGS

FIG. 1 b is an elevation view of the radiating element of FIG. 1 a, sectioned along the line 1—1.

DESCRIPTION OF PREFERRED EMBODIMENT

Figure 1A:
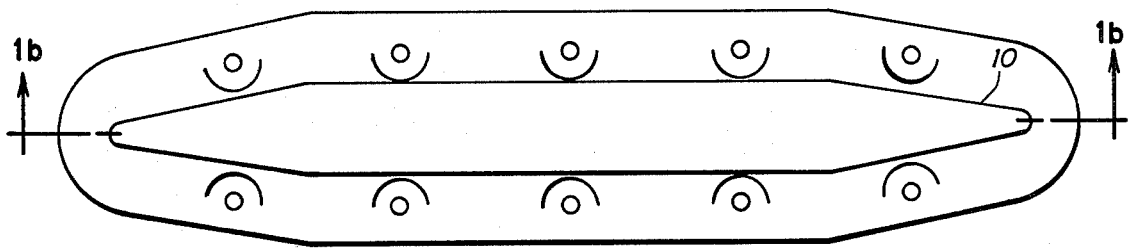
FIG. 1 a is a plan view of the radiating element of an antenna system according to the invention.
Figure 1B:
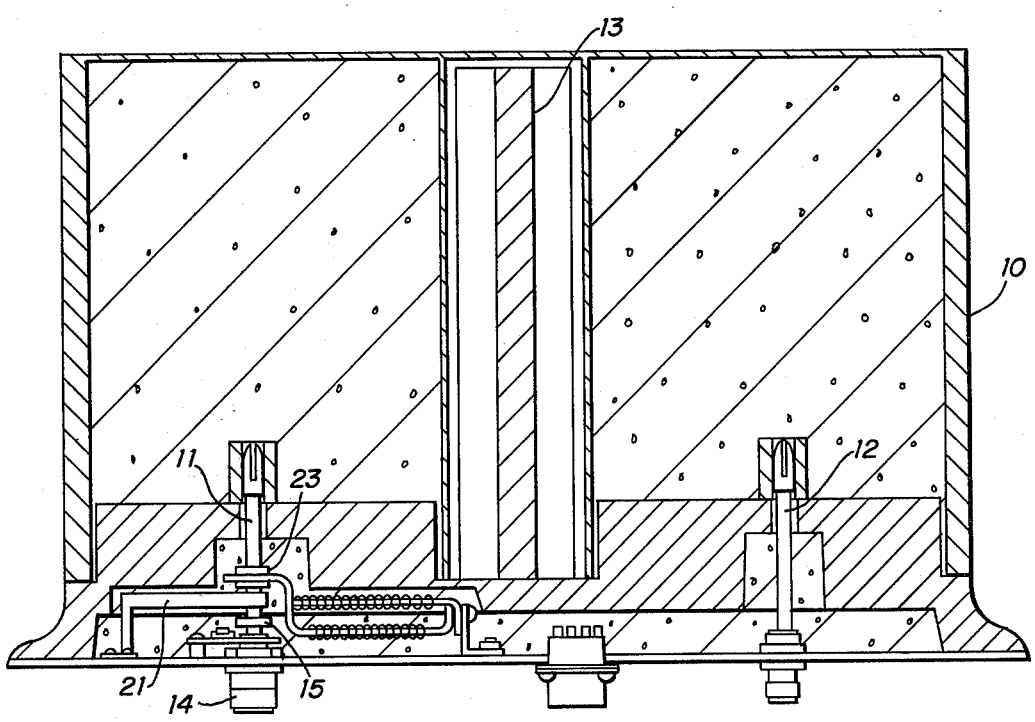
Figure 2:
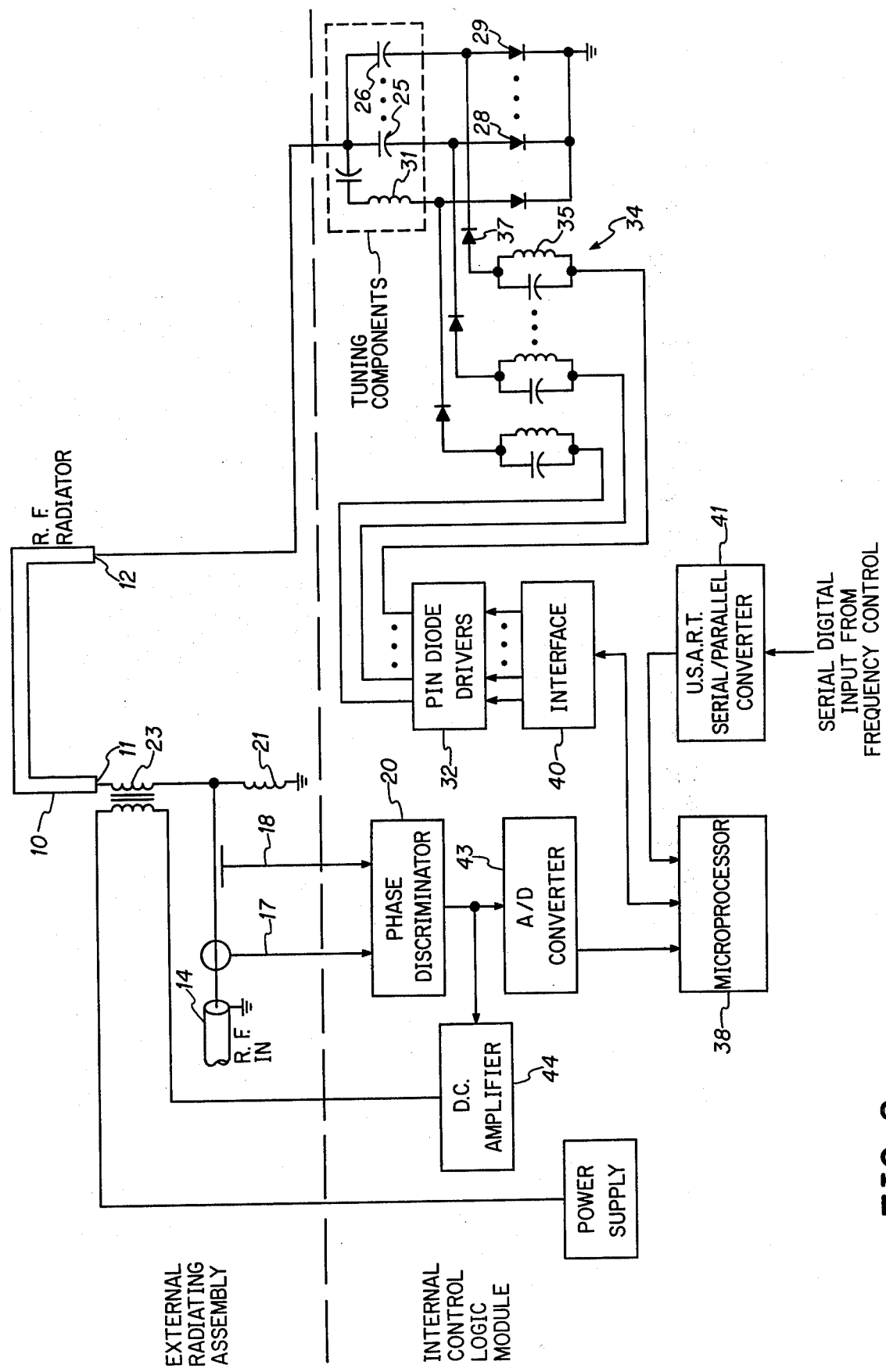
FIG. 2 is a combined block and schematic diagram of an antenna system in accordance with the invention.

FIG. 1 shows physical features of the external radiating assembly of an antenna system according to the invention. The radiating element or radiator 10 is a folded monopole element with first and second terminals 11 and 12. A slot 13 in the radiator creates a fixed inductance which can be resonated to a desired frequency by a selected capacitance, as will be described below. Terminal 11 is connected to the radio frequency input which is connected at connector 14. Various other elements are connected at terminal 11, as can also be seen in FIG. 2, an electrical diagram. A sensor coil 15 provides a current lead 17 and voltage lead 18, as seen in FIG. 2 only, to a phase discriminator 20. A shunt inductor 21 adjusts the impedance of the antenna to 50 ohms. A saturable reactor 23 is used to make very fine tuning adjustments to the antenna.

FIG. 2 shows the electrical organization of the internal control logic module, separated from the external radiating assembly by a broken line. The elements of the control logic module are preferably located inside an aircraft, rather than externally, where they would contribute to the bulk of the radiating assembly and be exposed to temperature extremes. As noted briefly above, the proper value of capacitance connected from terminal 12 of radiator 10 to ground will resonate with the fixed inductance accompanying slot 13 of the radiator, in order to tune the radiator to a desired frequency. If a selected inductance is placed in series with the capacitance, the frequency band of the antenna can be shifted to a desired higher band.

In FIG. 2, capacitors 25 and 26 represent capacitances which can be switched to connect between terminal 12 and ground. The switching can be accomplished, for example, by the use of PIN diodes, represented in the figure by diodes 28 and 29. Capacitors 25 and 26 represent a series of capacitors which can be, for example, a series of binarily weighted values of capacitance for convenient switching to a selected value. An inductor 31 is also shown as switchable in parallel with the capacitances 25 and 26 to shift the frequency band of the antenna system.

Connected between PIN diodes and their drivers 32 are diode bias isolators such as isolator 34, each of which includes an RF choke such as choke 35. It has been found advantageous to include diodes such as diode 37 between the isolators and the PIN diodes to disconnect the isolators from the tuning capacitors such as capacitor 26, when the diodes such as diode 29 is in the nonconducting mode. It has also been found advantageous to arrange the circuitry as shown so that the PIN diodes such as diodes 28 and 29 are heat sunk directly to ground, in order to dissipate the heat generated by RF current through them.

The switching of the PIN diodes is initited by microprocessor system 38. Control of the switching can be effected from one 8 bit I/O port, using a peripheral interface adaptor (PIA) 40 to interface the microprocessor to driver amplifiers 32. The microprocessor system receives a parallel data input from a Universal Synchronous/Asynchronous Receiver Transmitter (USART) 41. The USART serves as a serial-to-parallel converter for commands from a radio not shown. The commands convey to the antenna system the frequency which is to be used for transmitting and/or receiving.

The microprocessor 38 also receives the output of phase discriminator 20, converted to digital form analog-to-digital converter 43. The output of phase discriminator 20 also goes to DC amplifier 44, which controls saturable reactor 23.

Microprocessor 38 stores in a nonvolatile memory a lookup table a reference values of tuning capacitance which will tune the antenna for the various frequencies at which it may be used. The table can also contain values of inductors like inductor 31 which will provide selected frequency bands of operation.

In operation, when microprocessor 38 receives through USART 41 a new frequency to be used by the antenna, it looks up in its table the tuning capacitance reference values for frequency values bracketing the new frequency to be used. Then by interpolation, it derives a value of capacitance corresponding to the particular new frequency.

Once the value of tuning capacitance has been calculated, the microprocessor is in a position to switch the appropriate value into the circuit at terminal 12, by means of the PIN diodes. This and the calculation functions are represented by block 46 in the flow chart of FIG. 3.

Once the selected values of capacitance have been switched to terminal 12 of the radiator, the action of phase discriminator 20 driving DC amplifier 44 operates saturable reactor 23 to fine tune the antenna. This necessitates applying a signal of the selected frequency of operation at the RF input to radiator 10. Microprocessor 38 examines the output of phase discriminator 20 by way of analog-to-digital converter 43, until the phase reading stabilizes at the fine tuned value, in response to the action of saturable reactor 23.

Figure 3:
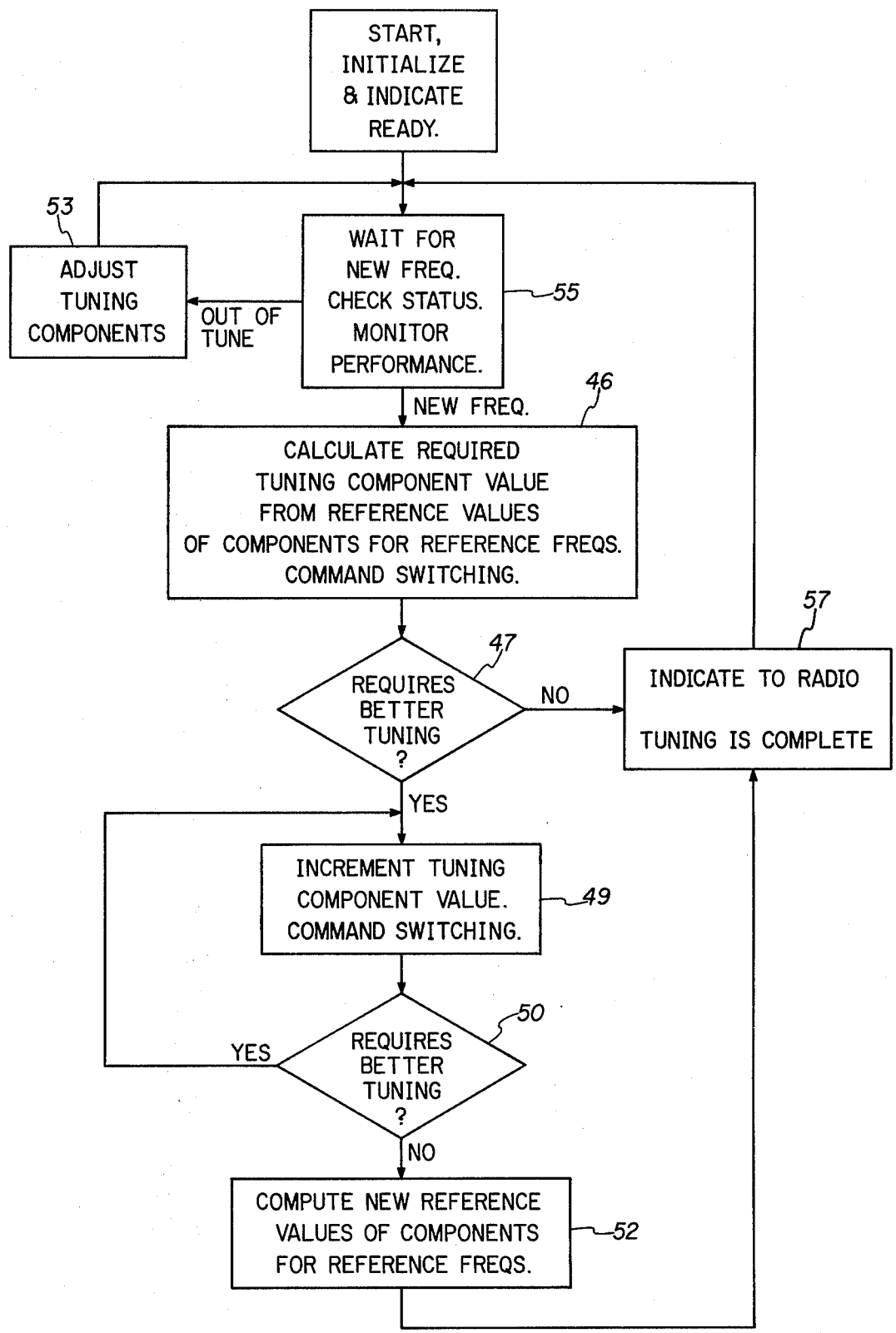
FIG. 3 is a flow chart of computation and control steps in the operation of the system of FIG. 2.

As indicated by decision block 47 of FIG. 3, if the phase discriminator indicates that the antenna is not sufficiently tuned, then microprocessor 38 selects a new value of tuning capacitance to obtain better tuning, as indicated by block 49 in FIG. 3. Although block 49 says "Increment" the tuning component value, it may be appropriate to decrement the value of capacitance, depending upon the sign of the phase detected by discriminator 20. An acceptable approach to changing the value of capacitance at terminal 12 is to change that value by the smallest increment of capacitance in the network of tuning capacitors. After each such change and allowing for the action of saturable reactor 23 to fine tune, the microprocessor 38 checks the output of phase discriminator 20 to see whether better tuning is required, as indicated in decision block 50 of FIG. 3. If further tuning is required, then the function of block 49 is repeated.

If further tuning is not required, then microprocessor 38 is in a position to compute improved reference values of capacitance to insert in its lookup table, as indicated by block 52 of FIG. 3. One method of modifying the reference values of capacitance associated with the tuning just completed is to increment (or decrement) the bracketing reference values by the amount that the calculated tuning capacitance value had to be changed in order to provide correct tuning.

When the functions of block 47 or block 52 are complete, processor 38 indicates to the radio which is to use the frequency that tuning is complete (block 57, FIG. 3). After this indication, the processor returns to the waiting-monitoring state of block 55.

It is advantageous to provide a manual switch override of the steps of block 52, to prevent operation of the reference values in certain cases. One example of such a situation, might be if icing over of the antenna altered the capacitance required for correct tuning, but the icing condition is regarded as temporary.

A somewhat related function is that of block 53 in FIG. 3. If the antenna is tuned to a particular frequency, and the radio is operating at that frequency, the microprocessor is in the state indicated by block 55, monitoring performance and checking status. If it detects from the phase discriminator 20, that the antenna is no longer in tune, then the function of block 53 is performed, incrementing or decrementing the tuning component values to keep the antenna in tune. Fine tuning is accomplished by the saturable reactor loop as before. Since this is a transient tuning maintenance condition, reference values of tuning components are not altered by the function of block 53.

There is another quite suitable method of providing the tuning capacitance values to be used for a requested frequency. Most users of the antenna system and its associated radio will only make use of a relatively limited number of frequencies, say, for example, twenty selected frequencies. Thus, it is useful to provide, in addition to the table of reference values of tuning components, a second table of values for these particular frequencies that the user requires. When a frequency is requested by the radio, the second table is searched to see if it contains the tuning capacitance value for the requested frequency. If so, then this value is immediately employed in tuning the antenna. If not, then the reference values are used to calculate the value of tuning capacitance, using interpolation. If accurate tuning is not obtained, for the stored value of capacitance or for a newly calculated value, then microprocessor 38 iteratively increments and/or decrements the value of tuning capacitances, while examining the output of phase discriminator 20. When proper tuning has been achieved, then the resulting value of tuning capacitance is is entered in the second table for the associated frequency.

From the foregoing, it can be understood that when an antenna system according to the invention is first put into use, a tuning capacitance value computed from reference values may not provide precise tuning. However, after some use of the antenna system throughout the frequency band of interest, accompanied by required alterations of the stored reference values, the values of tuning capacitance calculated from the reference values should immediately put the antenna in tune. As a result, the associated radio can be switched from frequency to frequency very quickly, with the antenna system keeping pace. So long as the calculated values suffice, the antenna can be brought into tune in radio silence. For transient conditions occurring during operation at a particular frequency, the tuning capacitance can be adjusted slightly as indicated in block 53 of FIG. 3 to maintain the antenna in tune.

Because of its tuning capability, the antenna system of the present invention can use a relatively small external radiator assembly suitable for supersonic speeds. In addition, the structure of the antenna system permits the internal control logic module elements to be located interior to the aircraft, where they can be sheltered from temperature extremes.

We claim:

1. An antenna system suitable for airborne use, of the type having a blade forming a folded monopole antenna with a first terminal serving as a radio frequency input and a second terminal connectable to tuning apparatus, the improvement comprising:
   tuning components, switchable to various values, connected at said second terminal;
   means, responsive to the selection of a frequency to be used, for computing, from stored reference values, the values of tuning components calculated to render said antenna substantially in tune at the frequency selected to be used, and for switching said tuning components to said calculated values;
   means at said first terminal for detecting the extent to which the antenna is in tune at said selected frequency;
   means, responsive to an indication from said means for detecting that said antenna is substantially out of tune at said selected frequency, for switching said tuning components until new values are reached for which the antenna is substantially in tune: and
   means, responsive to said new tuning component values, for computing and storing new reference values.

2. The antenna system of claim 1 further including
   means for storing, for a plurality of commonly used frequencies, the value of tuning components found to render said antenna substantially in tune at a selected frequency, and
   means responsive to a newly selected frequency value received from a radio for detecting that the value corresponding to the best tuning component configuration for the newly selected frequency has previously been determined and stored, and for directing said means for switching to directly switch to the best antenna tuning configuration of components for the newly selected frequency.

3. The antenna system of claim 1, wherein said tuning components include binarily weighted capacitors.

4. The antenna system of claim 3, wherein said means for switching includes a plurality of PIN diodes, each in series with one of said capacitors.

5. An antenna system suitable for airborne use, of the type having a blade forming a folded monopole antenna with a first terminal serving as a radio frequency input and a second terminal connectable to tuning apparatus, the improvement comprising:
   tuning components, switchable to various values, connected at said second terminal and comprising:
     a plurality of capacitors, of binarily weighted values,
     a plurality of switching diodes, each heat sunk to ground and in series with one of said capacitors,
     a plurality of driving circuits, one associated with each of said switching diodes, and
     a plurality of isolating diodes, one connected between each of said driving circuits and the associated switching diode;
   means, including a processor and responsive to the selection of a frequency to be used, for computing, from stored reference values of tuning capacitance, the value of tuning capacitance calculated to render said antenna substantially in tune at the frequency selected to be used and for activating said driving circuits to switch said capacitors to provide said calculated value;
   means at said first terminal and including a phase discriminator for detecting the extent to which the antenna is in tune at said selected frequency;
   means, further including said processor and responsive to an indication from said discriminator and that said antenna is substantially out of tune at said selected frequency, for activating said drive circuits to switch said tuning capacitors until new values are reached for which the antenna is substantially in tune; and
   means including said processor and responsive to said new tuning component values, for computing and storing new reference values.

* * * * *